United States Patent [19]
Hardt et al.

[11] Patent Number: 6,058,011
[45] Date of Patent: May 2, 2000

[54] COMPUTER CHASSIS WITH INTEGRATED COOLING FEATURES

[75] Inventors: Thomas T. Hardt, Missouri City; Wade D. Vinson, Spring; Kurt A. Manweiler; Joseph R. Allen, both of Tomball, all of Tex.

[73] Assignee: Compaq Computer Corporation, Houston, Tex.

[21] Appl. No.: 09/249,039

[22] Filed: Feb. 12, 1999

[51] Int. Cl.[7] ...................................................... H05K 7/20
[52] U.S. Cl. .......................... 361/694; 361/687; 361/695; 361/697; 361/796; 361/722; 361/717; 165/80.3; 165/106.33; 165/121; 165/126; 454/184; 174/15.1; 174/16.1
[58] Field of Search ..................................... 361/683, 680, 361/684–687, 690–697, 725–727, 736, 794, 797, 802; 312/223.2, 204, 298, 334.4, 334.8, 236, 138, 336.8; 62/259.2, 404, 407, 419; 29/401.1, 402.03, 402.08, 402.09, 402.04, 592.1, 825, 830, 831; 364/708, 708.1; 454/184; 181/151, 260, 202, 200; 165/80.3, 104.33

[56] References Cited

U.S. PATENT DOCUMENTS

| | | |
|---|---|---|
| 3,691,432 | 9/1972 | Edfords et al. ............................ 317/100 |
| 4,977,532 | 12/1990 | Borkovicz et al. ....................... 364/708 |
| 5,460,441 | 10/1995 | Hastings et al. .......................... 312/298 |
| 5,813,243 | 9/1998 | Johnson et al. .......................... 62/259.2 |
| 5,816,673 | 10/1998 | Sauer et al. ............................. 312/223.2 |

*Primary Examiner*—Leo P. Picard
*Assistant Examiner*—Michael Datskovsky
*Attorney, Agent, or Firm*—Jenkens & Gilchrist, a Professional Corporation

[57] ABSTRACT

A computer system that includes a chassis and a removable module configured to be housed inside the chassis. The chassis includes an interface plate incorporated therewith. The interface plate is perforated to allow air to flow through the interface plate and along peripheral cards attached to the interface plate. The air that flows along the peripheral cards then flows through perforations in a cover that is used to secure the peripheral cards into their associated card slots. The cover then directs the air into a primary air passage used to exhaust air pulled through the chassis.

14 Claims, 7 Drawing Sheets

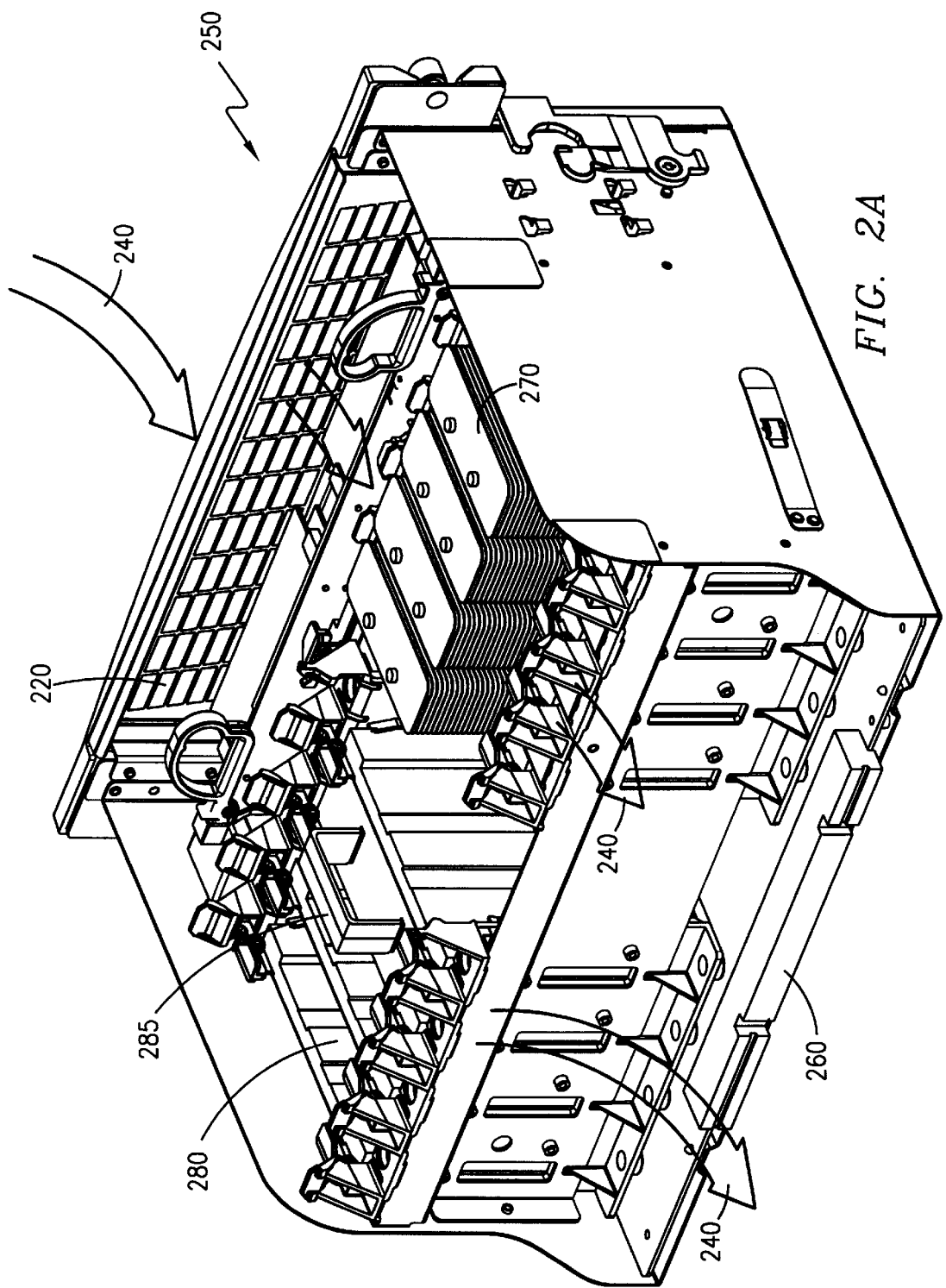

COMPUTER CHASSIS WITH INTEGRATED COOLING FEATURES

CROSS-REFERENCE TO RELATED APPLICATIONS

This Application relates to the application entitled: COMPUTER CHASSIS AIRFLOW CONTROL MECHANISMS, Tom Hardt, Joseph Allen and Tod Cox inventors, (Attorney Docket Number, 27757/00203, U.S. Application No. 09/249,031, filed Feb. 12, 1999) which is incorporated in its entirety herein by reference.

FIELD OF THE INVENTION

This invention relates generally to a computer chassis for free standing or rack mounted use, and more particularly, but not by way of limitation, to a computer chassis with airflow control mechanisms that enable cooling of electronic components housed inside the computer chassis.

BACKGROUND OF THE INVENTION

Networks serve the purpose of connecting many different personal computers (PCS), workstations, or terminals to each other, and to one or more host computers, printers, file servers etc., so that expensive computing assets, programs, files and other data may be shared among many users.

In a network utilizing a client/server architecture, the client (personal computer or workstation) is the requesting machine and the server is the supplying machine, both of which may preferably be connected via the network, such as a local area network (LAN), wide area network (WAN) or metropolitan area network (MAN). This is in contrast to early network systems that utilized a mainframe with dedicated terminals.

In a client/server network, the client typically contains a user interface and may perform some or all of the application processing and, as mentioned above, can include personal computers or workstations. The server in a client/server network can be a high-speed microcomputer or minicomputer and in the case of a high-end server can include multiple processors and mass data storage such as multiple CD-ROM drives and multiple hard drives, preferably with redundant array of inexpensive disk (RAID) protection. An exemplary server such as a database server maintains the databases and processes requests from the client to extract data from or update the database. An application server provides additional business processing for the clients. The network operating system (NOS) together with the database management system (DBMS) and transaction monitor (TP monitor) are responsible for the integrity and security of the server.

Client/server networks are widely used throughout many different industries and business organizations, especially where mission-critical applications requiring high performance are routinely launched. The mass storage and multiprocessing capabilities provided by current client/server network systems (for example, the high-end servers) that run such applications permit a wide range of essential services and functions to be provided through their use.

As can be appreciated, many businesses are highly dependent upon the availability of their client/server network systems to permit essential network services and functions to be carried out. As client/server network systems become increasingly essential to the everyday operations of such businesses, additional steps need to been taken in the design and construction of the server in the client/server network system to ensure its continuous availability to the clients. That is to say, in the design and construction of a server, steps need to be taken to ensure that the server can be operated with little or no downtime.

It can be appreciated by those skilled in the art that high availability, reliability and serviceability are valuable design aspects in ensuring that a server is a "zero downtime" system that will operate with little or no downtime. The modularity of components within a server has been recognized as an important design consideration in ensuring that the downtime of a server will be minimized. Modules can be removed and examined for operability or other purposes much easier than permanently mounted fixtures within a server chassis. When various components of a server can be provided in a modular form, they can also be readily replaced to maintain the operational status of the server with minimal downtime.

Removable modular components may include disc drives and power supplies. As described above, the removability of modular components allows for better overall serviceability of the computer system which is a distinct advantage. For example, a defective power supply in the server generally requires prompt replacement in order to limit downtime. Modular components and connectors facilitate prompt replacement and are thus popular in many computer designs.

Originally, a rule of practice in the maintenance of modular components or printed circuit boards of a server was that of turning the power to the server off before any modular components or printed circuit boards were removed from or added to the chassis or support frame of the server. Recent innovations have centered around a highly desirable design goal of "hot-pluggability" which addresses the benefits derived from inserting and removing modular components and printed cards from the chassis of the server when the server is electrically connected and operational. It can be readily appreciated that modularization and hot-pluggability can have a significant bearing on the high availability aspect of a high-end server.

Hot-pluggable components may include storage or disc drives, drive cages, fans, power supplies, system I/O boards, control boards, processor boards, and other sub-assemblies. The ability to remove these constituent components without having to power down the server allows for better overall serviceability of the system, which is a distinct advantage to both the user and the maintenance technician.

Component redundancy has also been recognized as an important design consideration in ensuring that a server will operate with little or no downtime. Essentially, component redundancy is typically provided in a system to better ensure that at least one of the redundant components is operable, thereby minimizing the system down time. With component redundancy, at least two components are provided that can perform the same function, such that if one of the components becomes faulty for some reason, the operation fails over to the redundant component. When at least one of the redundant components is operable, continued operation of the computer system is possible even if others of the redundant components fail. To further enhance reliability and serviceability, redundant components have been made hot pluggable.

Dynamic reconfiguration of a server system can also be accomplished by providing upgradable modular components therein. As can be readily appreciated, this objective can be accomplished by the addition or substitution of components having different circuits, preferably updated or upgraded, disposed there within. When components are redundant and hot pluggable, reconfiguration of the server is often possible without taking the server offline.

Another important design aspect with respect to providing redundant and hot pluggable components in a server system is to ensure and maintain a safe working environment while the server is operating and being repaired or upgraded. Accordingly, when the system components are swapped or upgraded, the exposure of hot connectors and contacts must be kept to a minimum. It can be appreciated by those skilled in the art that further developments in this area would significantly enhance the reliability and serviceability aspects of a high-end server system.

To further enhance the serviceability of server systems, additional innovations may be required in the design and construction of diagnostic sub-systems thereof. In existing client/server network systems it is often difficult to obtain, in a timely manner, important diagnostic data and information corresponding to a component failure in order to facilitate the quick serviceability of the server. Therefore, it can be appreciated that the more information that can be readily provided to locate a defective component or problem with the server, the better the optimization of the amount of time the server is up and running.

Although the cooling of computer systems has always been a concern with computer designers, the form factor of the chassis, "hot" pluggable components, and the high demands for improved reliability of the client/server network systems (with ever-increasing microprocessor power dissipation and system power consumption) have created additional problems with cooling system design, especially in temperature monitoring and temperature control. Not only are the high end servers utilizing the newer high powered processors, but they are also utilizing multiple processors, thereby creating even more heat within the system.

Most often, microprocessors and associated electrical components are cooled by airflow. Fans are used to push or pull air from one side of a chassis holding the electrical components, across the electrical components and out the other side of the chassis. By forcing air to flow over the electrical components, heat is dissipated thereby preventing the electrical components from overheating and failing.

The ability to cool electrical components with air is restricted by the ability to channel or direct the airflow through the chassis and across the electrical components housed therein. Air follows the path of least resistance, and in many cases, the path of least resistance does not cross the electrical components that need to be cooled. Accordingly, large volumes of air may be pulled through a chassis without ever cooling certain ones of the electrical components contained inside. The end result of this scenario being that the electrical components overheat and the computer system fails.

To direct the airflow through the chassis, existing systems include airflow barriers placed throughout the chassis. These airflow barriers, however, are generally designed around certain configurations of electrical components within the chassis, i.e., certain electrical components serve as airflow barriers. These electrical component configurations are often altered when particular components are removed or added. By removing or adding new components, the preferred airflow through the chassis is disturbed and air may stop flowing in particular areas of the chassis. These areas are commonly referred to as "dead spots."

A particular problem arises with respect to preventing "dead spots" around I/O or any other peripheral cards. I/O cards, for example, are generally arranged in closely spaced rows and located at or near the back of the computer chassis. Because of the arrangement and placement of the I/O cards, existing systems have difficulty in properly cooling them. Even though I/O cards generate relatively small amounts of heat, they can generate enough heat to cause a particular card and/or other computer system components to fail.

Because failure of any electrical component could disrupt the operation of the entire computer system, it is desirable to have a computer chassis that produces high efficiency cooling, cools all electrical components housed inside the chassis, minimizes system down time, and adapts for different electrical component configurations.

SUMMARY OF THE INVENTION

The present invention overcomes the above identified problems as well as other shortcomings and deficiencies of existing technologies by providing a computer system that produces high efficiency cooling of all electrical components within a computer chassis.

The present invention provides a chassis for housing electrical and computer components, the chassis includes a front region and a rear region. In one embodiment, the present invention also includes a removable module that is housed in the rear region of the chassis. The removable module has a first side and a second side and an air passage portion between the two sides. The removable module also has a component housing portion for housing electronic components such as peripheral cards, I/O cards, etc. In addition to the chassis and the removable module, the present invention also includes a perforated plate integrated with the second side of the removable module and an air circulator means. The air circulator means can be any device that is capable of moving air, e.g., a fan., so long as the device moves air through the airflow passage portion of the removable module and through the perforations in the plate which is integrated into the second side. The present invention further includes a cover secured to the removable module. The cover is also designed to engage or touch the first side of the removable module. The cover is perforated to allow air to flow from the plate, which is integrated into the second side through the cover.

In one embodiment of the present invention, the cover engages or touches particular electronic components housed in the component housing portion of the removable module. For example, the cover may engage an I/O card and thereby secure the I/O card into an associated connector. It is also contemplated that the cover can pivot to allow a user full access to the electronic components engaged or covered by the cover.

In another embodiment of the present invention, the electronic components housed in the removable module include interfaces such as I/O connectors. These interfaces are secured to the plate that is integrated with the second side of the removable module. The perforations in the plate may be located between the interfaces. Further, the perforations may vary in size and location according to fluid dynamic principles. That is, the perforations can be sized and spaced so as to generate an even airflow through the perforations.

In yet another embodiment of the present invention, the computer system includes a top panel that is connected with the chassis. The top panel may cover both the front and rear regions of the chassis or just the front region of the chassis. Further, the top panel can engage a cover extender, which is connected to the cover. The cover extender and the cover, together, form a tunnel that directs air flow from the front region of the chassis to the airflow passage portion of the removable module. The cover extender can also be used to restrict airflow from the front region of the chassis into the electronic component portion of the removable module.

BRIEF DESCRIPTION OF THE DRAWINGS

A more complete understanding of the present invention may be had by reference to the following Detailed Description and appended claims when taken in conjunction with the accompanying Drawings wherein:

FIG. 2a is a rear, right side perspective of a processor module configured to be housed in the computer chassis;

DETAILED DESCRIPTION

Figure 1:
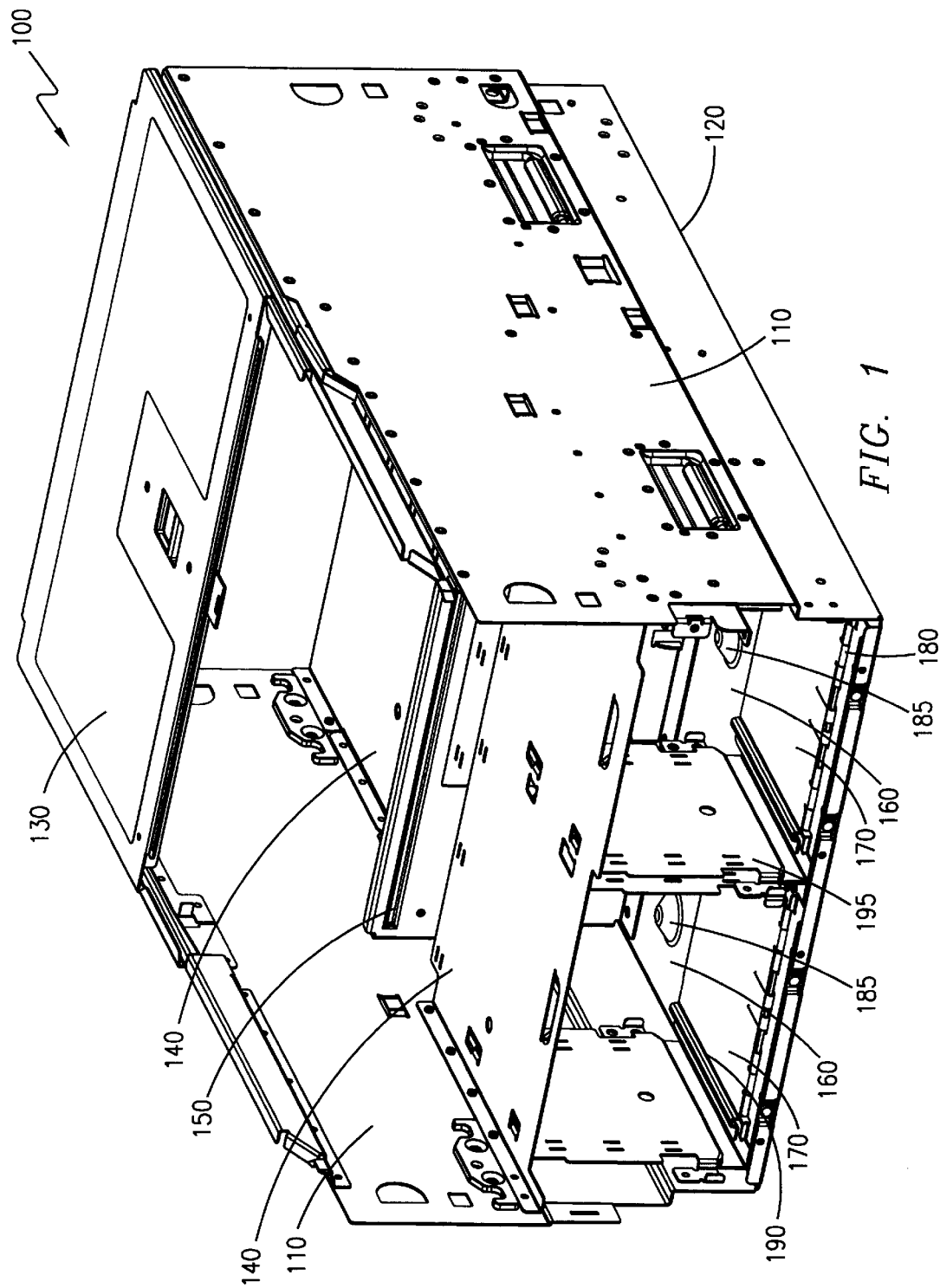
FIG. 1 is a rear perspective of a computer chassis constructed in accordance with the principles of the present invention.

In the drawings, like or similar elements are designated with identical reference numerals throughout the several views and the various elements depicted are not necessarily drawn to scale.

Now referring to FIG. 1, there is illustrated a rear perspective of a chassis 100 constructed in accordance with the principles of the present invention. The chassis 100 includes sidewalls 110, bottom plate 120 and fixed top plate portion 130. These three elements in combination define, in one embodiment, the shell of chassis 100. Chassis 100 also includes a tier divider 140 and a mid-plane board 150. Tier divider 140 generally divides the chassis 100 into a top region and a bottom region. The mid-plane board 150 generally divides the chassis 100 into a front region and a rear region. Thus, the chassis 100 is divided into at least four regions.

The chassis 100, illustrated in FIG. 1, also includes two insertion slots 160. These insertion slots 160 are for receiving removable components into the chassis 100. For example, the insertion slots 160 can be configured to receive removable power supplies. Although two insertion slots 160 are illustrated, one skilled in the art will recognize that the number of insertion slots can be varied to accommodate any number of removable components.

The insertion slots 160 are configured to be closed by airflow control doors 170. The airflow control doors 170 are independently attached to the chassis 100 by hinges 180 or any other rotatable means. Thus, the airflow control doors 170 can rotate between an open position (shown) and a closed position. The hinges 180, in one embodiment, bias the airflow control doors 170 towards the closed position. When the airflow control doors 170 are not engaged by removable components, they, thus, will be in the closed position. In this closed position, the airflow control doors 170 engage or nearly engage the tier divider 140, one of the sidewalls 110 and a separator 195.

The airflow control doors 170, when in the open position, can engage a removable component by way of guide mechanism 190 that is connected to the airflow control doors 170. Although the guide mechanism 190 can be a variety of mechanisms, FIG. 1 illustrates only a set of guide rails. It is contemplated that the guide mechanism 190 could be a single guide rail, guide grooves, etc.

The chassis 100 is further illustrated to include a support mechanism 185. The support mechanism 185 is for supporting a removable component once inserted into one of the insertion slots 160. In effect, the support mechanism 185 supports the removable component so that it is at a particular angle relative to the computer chassis 100. By supporting the removable component at the proper angle, the support mechanism 185 helps assure that any electrical connections on the removable component line up with the any corresponding connections inside the computer chassis 100, such as those on the mid-plane board 150. The support mechanism 185 is illustrated in FIG. 1 to be a single raised, circular support. It is contemplated that the support, however, could be multiple supports of any shape or size—including one or more rails for supporting the removable component along its length.

Figure 2:
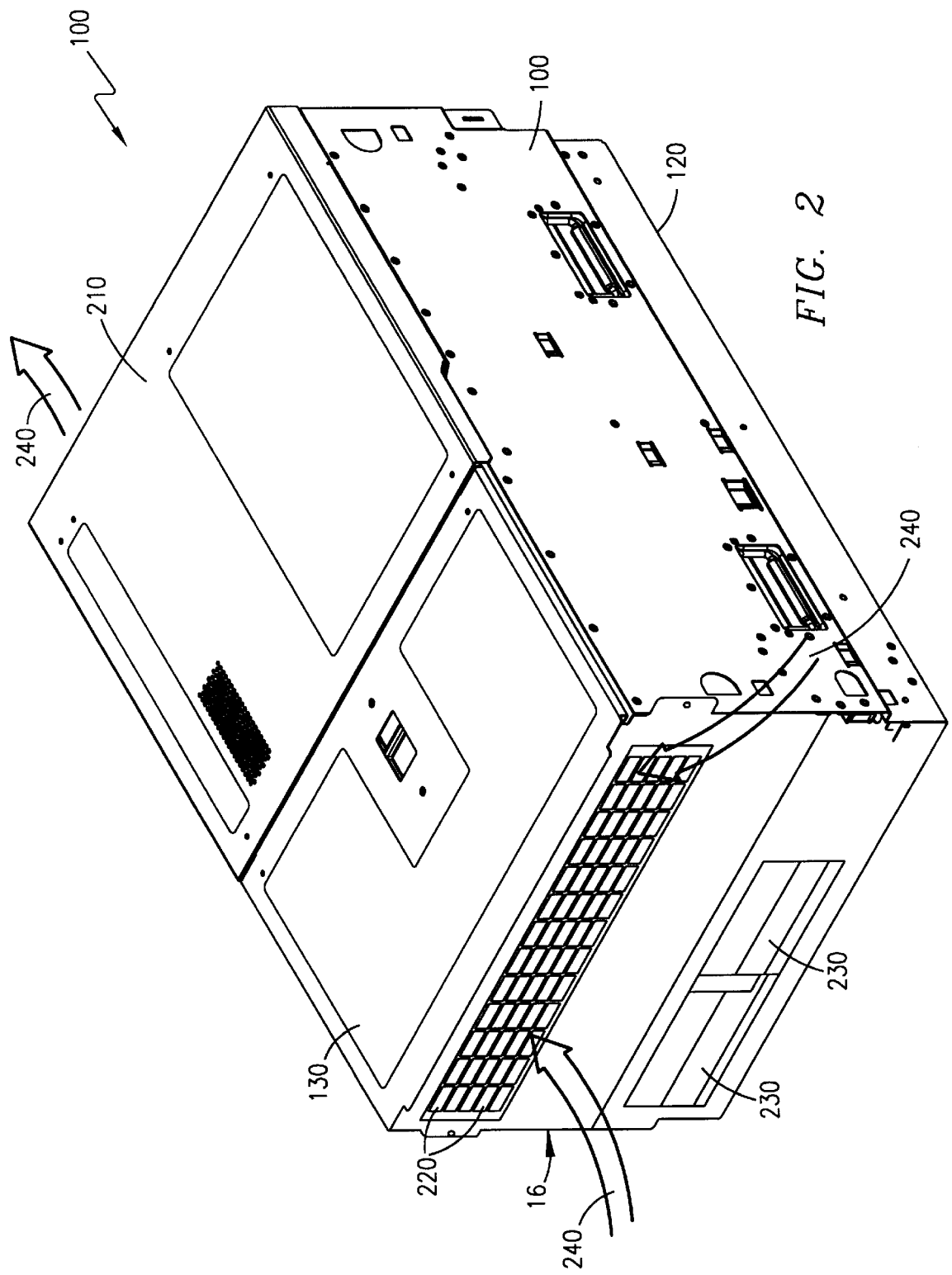
FIG. 2 illustrates a front perspective of the computer chassis of FIG. 1 with a closed top.

Referring now to FIG. 2, there is illustrated a front perspective view of the computer chassis 100 of FIG. 1 with a closed top. The top of the computer chassis 100 can include two portions: a slidable top plate portion 210 and a fixed top plate portion 130. The slidable top plate portion 210 is configured to slide over the fixed top plate portion 130. In one embodiment, the slidable top plate portion 210 is completely removable from the chassis 100—as shown in FIG. 1. Whether the slidable top plate portion 210 is completely removed or merely slid back over the fixed top plate portion 130, a user has full access to the electrical components housed in the rear-upper quadrant of the chassis 100.

Also illustrated in FIG. 2 is an air intake 220, disk drives 230 and a primary airflow 240. In one embodiment the primary airflow 240 flows from the front of the chassis 100, through the air intake 220, across the electrical components housed inside the chassis 100 and out the back of the chassis 100. Other air intakes, although not shown, can be located on the chassis 100. For example, air intakes can be incorporated into the disk drives 230 or located below the air intake 220.

The primary airflow 240, once inside the chassis 100, may be diverted and directed to maximize cooling ability. FIG. 2a illustrates one example of how the primary airflow 240 can be directed once inside the chassis 100. FIG. 2a shows a rear right view of a processor module 250 that can be housed in the upper, front quadrant of the chassis 100 (shown in FIG. 2). The processor module includes the air intake 220, a mid-plane connector 260, processors 270 with heat sinks, and processor insertion slots 280. The primary airflow 240 enters the processor module 250 through the air intake 220. The air then flows through the heat sinks attached to the processors 270 thereby cooling the processors. The processor module 250, however, is configured to hold eight processors, not merely the four that are illustrated. In the configuration shown, the majority of the primary airflow 240 would flow through the open space above the empty processor slots 280. Thus, the processors 270 would not be cooled properly. To direct the airflow through the heat sinks associated with the processors 270, baffles, such as baffle 285, can be inserted into the empty ones of the processor slots 280.

For clarity, only one baffle 285 is illustrated in FIG. 2a. One skilled in the art, however, will understand that in the preferred embodiment, each of the empty processor slots 280 would include a baffle such as baffle 285. By blocking an otherwise unrestricted opening, baffle 285, when used in conjunction with other baffles (as needed), prevents the primary airflow 240 from following the unrestricted path over the empty slots. Instead, the baffles force the primary airflow 240 through the heat sinks associated with the processors 270 and thereby cool those processors 270. Although not shown, one skilled in the art will understand that additional baffles can be used to block airflow through other unrestricted openings and direct the primary airflow 240 through the heat sinks associated with the processors 270.

Figure 2B:
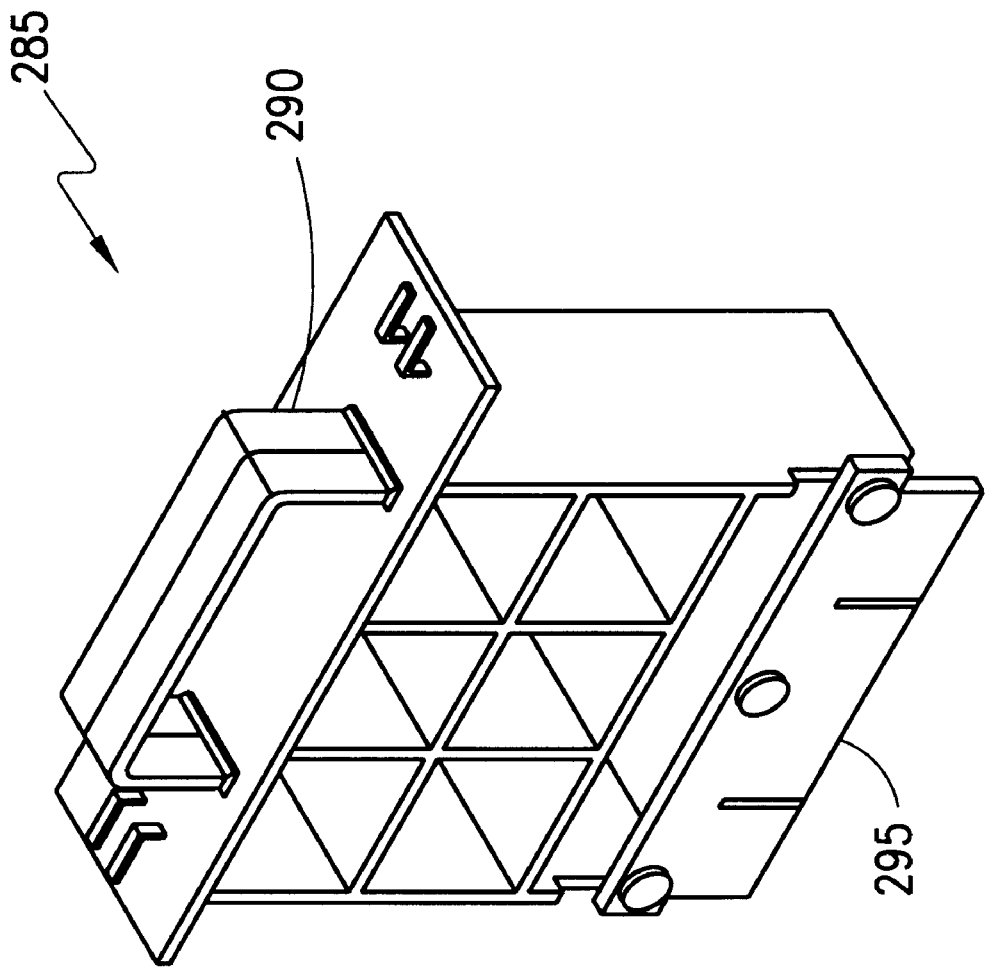
FIG. 2b is a side perspective of a baffle with attached circuitry.

FIG. 2b illustrates one embodiment of baffle 285. The baffle 285 includes a molding 290 connected to circuitry 295. The molding 290 should be shaped such that when the baffle 285 is inserted into one of the processor slots 280, the primary airflow over that processor slot 280 is blocked. The molding 290 should further be shaped such that when inserted into a particular processor slot 280, the molding engages any laterally-located component, thereby substantially preventing the primary airflow 240 from flowing between processor slots 280. That is, the molding 290 should engage the molding of another baffle inserted into an adjacent processor slot 280, or alternatively, the molding 290 should engage or nearly engage the heat sink associated with an adjacent processor such as processor 270.

Although molding 290 is shaped to incorporate a handle, the molding could be, instead, a simple planar surface and still restrict airflow in the fashion described. In fact, one skilled in the art will realize that molding 290 could be any one of a variety of shapes and still function properly.

In addition to the molding 290, baffle 285 includes circuitry 295. This circuitry 295 is inserted in one of the processor slots 280 wherein the circuitry 295 engages a connector (not shown) inside that particular processor slot 280. In one embodiment, the circuitry 295 includes circuitry for properly terminating unpopulated bus slots—although the circuitry 295 is by no means limited to this function.

Figure 3:
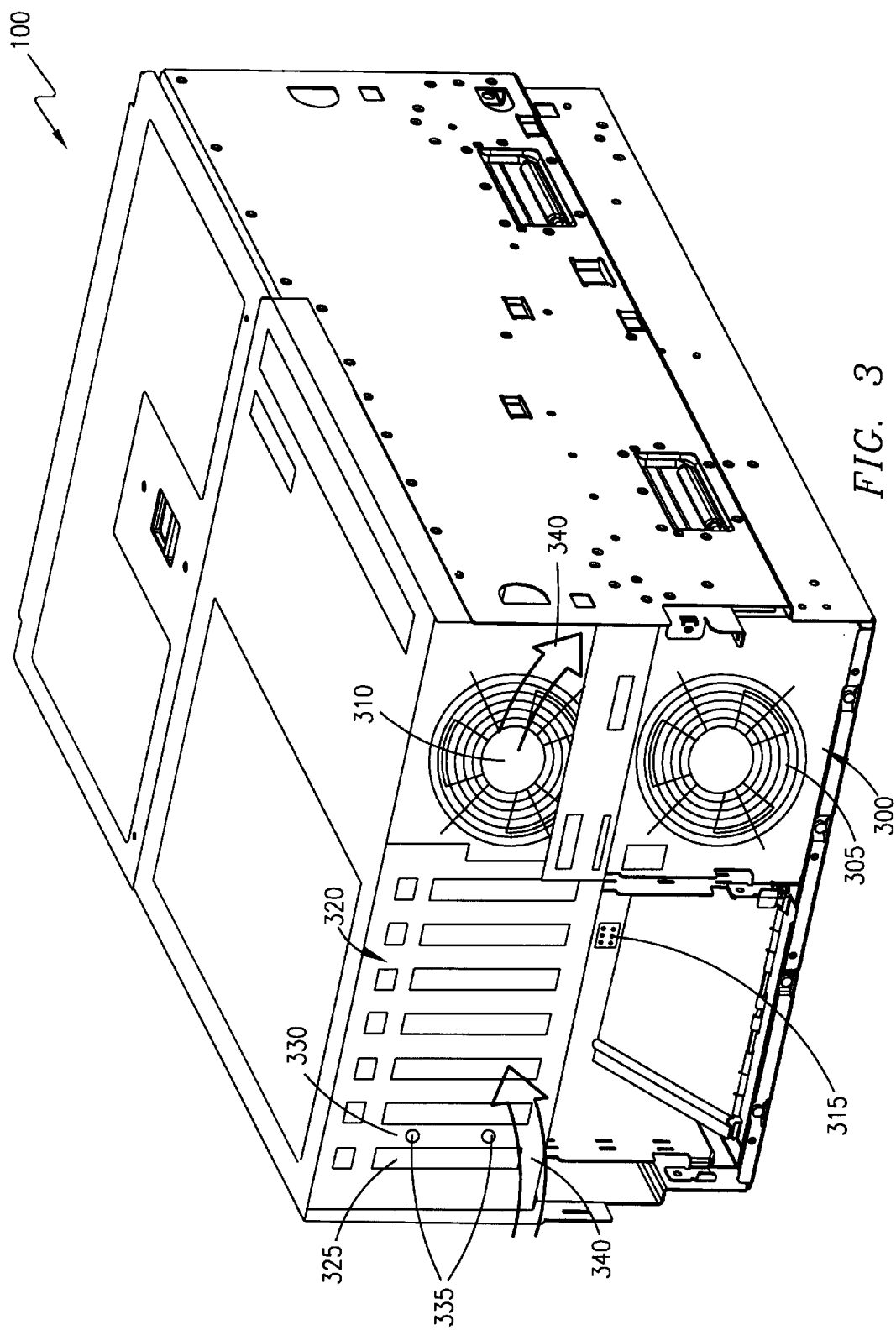
FIG. 3 is a rear perspective of a computer chassis constructed in accordance with the principles of the present invention.

Now referring to FIG. 3, there is illustrated a rear perspective of a chassis 100 constructed in accordance with the principles of the present invention. The chassis 100 includes a power supply 300 that has been inserted through the right insertion slot 160 (shown in FIG. 1). The power supply 300 is connected to the other electrical components housed inside the chassis 100 by way of an electrical connector like connector 315. Although it not necessarily need be, in this embodiment, the power supply 300 is both removable and hot pluggable. Power supply 300 includes an integrated fan 305 that can both cool the power supply 300 and be used to cool electrical components housed inside the chassis 100. The integrated fan 305, for example, can be used to pull air across any electrical component housed in the bottom region of the chassis 100.

The chassis of FIG. 3 not only includes the integrated fan 305, but also it includes an independent fan 310. Fan 310 can be used to cool electrical components housed in the upper quadrants of the chassis 100. In the embodiment illustrated in FIG. 3, the upper tier and the lower tier of the chassis 100 are independent in terms of airflow. Thus, both the integrated fan 305 and the fan 310 are needed to properly cool the components housed inside the chassis 100.

The chassis 100 illustrated in FIG. 3 also includes an I/O panel 320 behind which are peripheral cards (not shown). The I/O panel 320 has a series of removable slot covers 325. Once a slot covers 325 is removed, a user has access to the I/O connection of a particular peripheral card. Between the individual slot covers 325 are I/O panel supports 330 that provide structural support to the I/O panel 320. The I/O panel supports 330 are shown to include perforations 335 that allow air to be pulled into the chassis 100 and exhausted by the fan 310. This airflow pattern is illustrated as airflow pattern 340.

Figure 4:
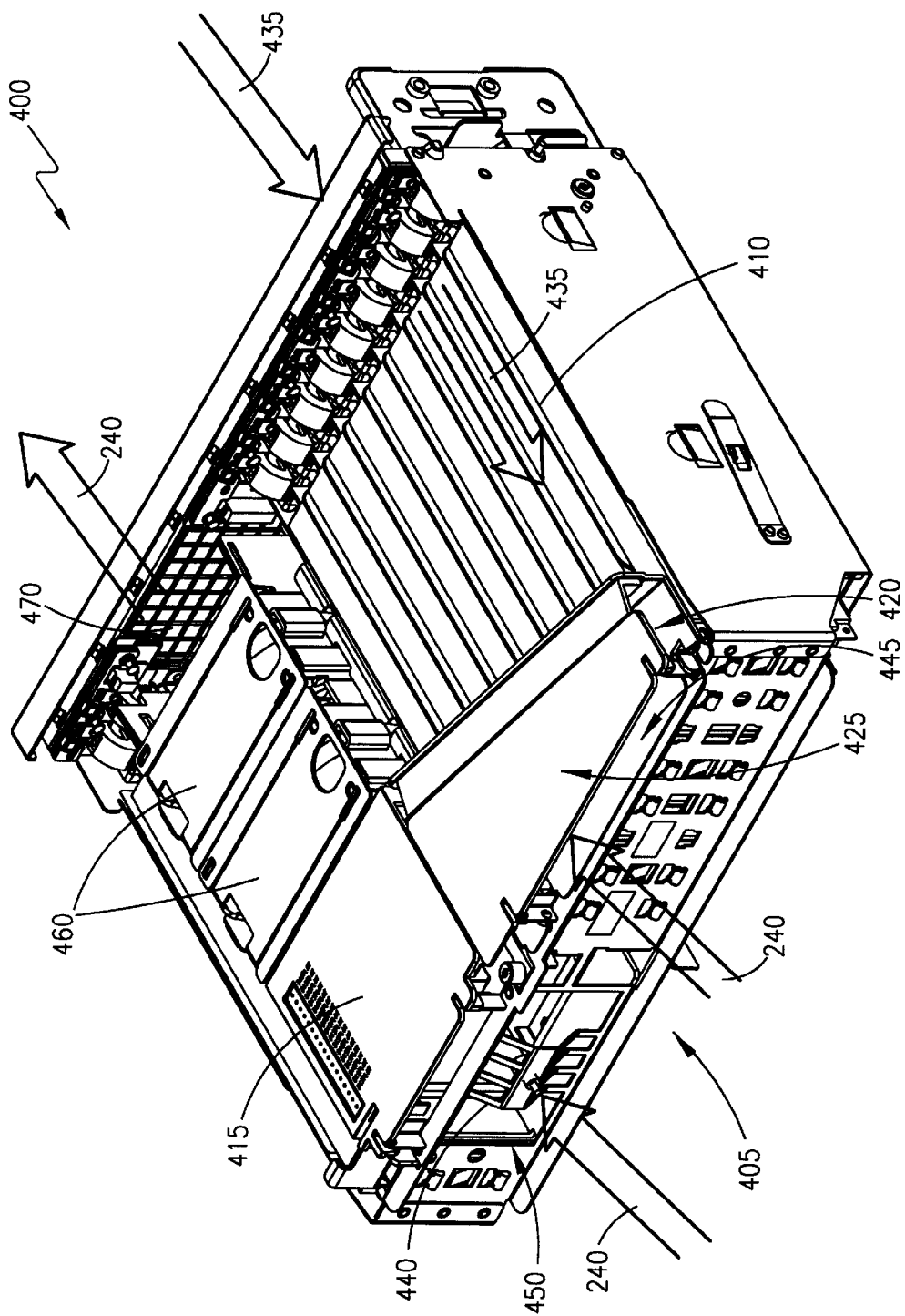
FIG. 4 is a front, left side perspective of an I/O module configured to be housed in a computer chassis.

Referring now to FIG. 4, there is illustrated a rear, right side 405 perspective of an I/O module 400 configured to be housed in the chassis 100. The I/O module 400, as shown, is configured to be insertable into the upper, rear quadrant of the computer chassis 100. When the I/O module 400, illustrated in FIG. 4, is fully inserted into the chassis 100, the interior-side 405 engages the mid-plane board 150 (see FIG. 1).

The I/O module 400 can also be designed to be quick-removable. That is, the I/O module 400 can be designed to be easily inserted/removed from the chassis 100. Because of the design of the I/O module 400 illustrated in FIG. 4, the I/O module 400 can be inserted/removed from the chassis 100 without tools and without hooking/unhooking interior cables. Although the I/O module 400 is shown to be quick-removable, it is contemplated that the I/O module could be of most any configuration.

Still referring to FIG. 4, the I/O module 400 includes ports 410 for receiving peripheral cards such as PCI cards. The I/O module further includes a tunnel cover 415, a card protector bottom plate 420 and a card protector top plate 425. These three pieces in combination help direct airflow across any peripheral cards connected to the ports 410. Further, the tunnel cover 415 helps create a primary tunnel 450, i.e., an air flow passage, (which includes the volume defined by the tunnel cover 415, the redundant fans 460, the airflow connector 440 and the exhaust panel 470) for the redundant fans 460 to pull air through. The card protector bottom plate 420, in addition to helping to direct airflow, protects the peripheral cards, when inserted into the ports 410, by engaging the cards and securing them in their respective ports 410.

There is also illustrated in FIG. 4, the primary airflow 240 and a secondary airflow 435. The primary airflow 240 originates at the front of the chassis 100, is pulled across the electrical components housed in the front of the chassis 100, enters both the primary tunnel 450 by way of the airflow connector 440, which may only be a series of perforations, and a secondary tunnel 445 created by the union of the card protector top plate 425, the card protector bottom plate 420, and in one embodiment, the fixed top plate portion 130. The air is then pulled through the redundant fans 460 and exhausted through the exhaust panel 470. The secondary airflow 435, on the other hand, enters the I/O module 400 via the perforations 335 in the I/O panel 320 (both of which are shown in FIG. 3). The air is pulled along any peripheral cards housed in the I/O module 400 thereby cooling the cards. The air is then pulled through perforations (not shown) in the card protector bottom plate 420 and joins the primary airflow 240. The size and location of the perforations in the card protector bottom plate 420 and the I/O panel 320 are variable according to the well-known principles of fluid dynamics.

Because users will need easy access to the ports 410 and the peripheral cards connected to the ports 410, all or some of the card protector bottom plate 420, the card protector top plate 425 and the tunnel cover 415 must quickly and easily move. Thus, it is contemplated that any one of or all of the card protector bottom plate 420, the card protector top plate 425 and the tunnel cover 415 can be pivotally attached to the I/O module 400 and/or each other. Thus, the pieces can pivot to allow access to the peripheral cards and ports 410.

Figure 5:
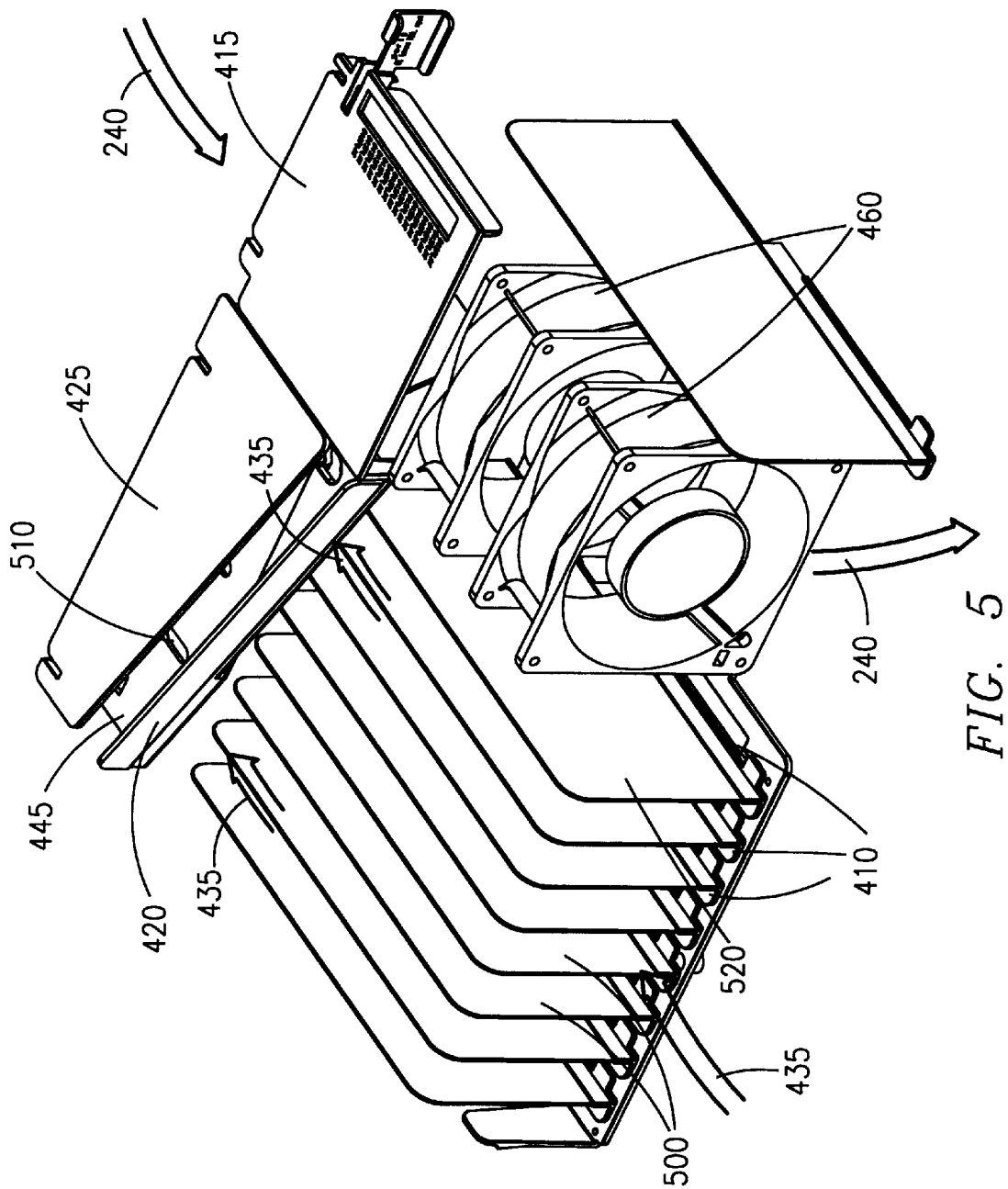
FIG. 5 is a perspective of the interior of the I/O module.

Referring now to FIG. 5, there is illustrated a perspective of the interior of the I/O module 400 illustrated in FIG. 4. FIG. 5 shows peripheral card dividers 500, including the far right peripheral card divider 520. The peripheral card dividers 500 are generally arranged perpendicular to the I/O panel 320 (see FIG. 3) and between the ports 410. The peripheral card dividers 500 serve to electrically isolate the individual ports 410, and any peripheral cards (not shown) contained therein. Electrical isolation becomes critical when the ports are configured to hold hot-pluggable cards because the peripheral card dividers 500 prevent a user from accidentally shorting-out one peripheral card when removing or inserting another.

The peripheral card dividers 500 also serve to direct the airflow 435 over the peripheral cards (not shown) when inserted into the ports 410. Further, the far right peripheral card divider 520 can be used to form a sidewall for the primary tunnel 450 (shown in FIG. 4). It is contemplated, however, that the peripheral card dividers 500 could be excluded in certain embodiments and that the peripheral cards themselves would direct the airflow 435.

FIG. 5 also illustrates perforations 510 in the card protector bottom plate 420. The secondary airflow 435 flows across the peripheral cards 500 and up through these perforations before it joins the primary airflow 240.

Therefore, as can be appreciated by one ordinarily skilled in the art, the above described invention provides a computer chassis with effective, efficient cooling features. In particular, the above described invention provides a chassis with an incorporated interface plate through which air is pulled. The air that flows through the interface plate enters a region of the chassis that houses peripheral cards and flows across these peripheral cards. The air then flows through perforations in a cover that is used to direct the airflow and to secure the peripheral cards into their respective connections. The air next flows along the cover and joins a primary airflow that cools or has cooled the other electrical components housed inside the chassis.

Although a preferred embodiment of the apparatus of the present invention has been illustrated in the accompanying drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A computer system comprising:

a chassis (100) for housing electronic components, the chassis (100) including a front region and a rear region;

a removable module (400) configured to be housed in the rear region of the chassis (100), the removable module including:

an interior side (405) and an exterior side, the removable module (400) further including an airflow passage portion (450) between the interior side (405) and the exterior side and a component housing portion for housing electronic components;

a panel (320) integrated with the exterior side of the removable module (400), the panel including perforations (335);

an air circulator means (460) for causing air to flow through the airflow passage portion of the removable module (400) and through the perforations (335) included in the panel (320);

a plate (420) secured to the removable module and engaging the interior side (405) of the removable module (400), the plate (420) including perforations (510) for allowing passage of air that flows from the perforations (335) included in the panel (320); and a removable baffle for directing airflow.

2. The computer system of claim 1, wherein the plate is configured to engage the electronic components when the electronic components are housed in the component housing portion of the removable module.

3. The computer system of claim 1, further comprising a peripheral card, the peripheral card connectable to a sort included in the component housing portion of the removable module, the peripheral card engagable by the plate.

4. The computer system of claim 3, wherein the peripheral card engages the plate.

5. The computer system of claim 1, further comprising:

a top plate connected with the chassis; and a card protector top plate proximately connected to the plate, the card protector top plate for engaging the top plate, the card protector top plate and the plate together for forming an airflow passage from the front region of the chassis to the airflow passage portion of the removable module.

6. The computer system of claim 5, wherein the card protector top plate is proximately connected with the airflow passage portion of the removable module and the interior side of the removable module.

7. The computer system of claim 5, wherein the top plate covers the front region of the chassis, the computer system further comprising a removable rear top plate secured to the chassis, the rear top plate covering the rear region of the chassis.

8. The computer system of claim 5, wherein the card protector top plate is pivotally connected so as to provide access to the electronic components when the electronic components are housed in the component housing portion of the removable module.

9. A computer system chassis (100) including a first region and a second region comprising:

a removable component (400) insertable into the chassis;

a front wall proximately connected to the removable component (400), the front wall including perforations (335) for allowing air to flow through the front wall;

a back wall (405) connected to the removable component (400), the back wall (405) generally parallel with the front wall, there being an airflow passage between the perforations (335) in the front wall and the back wall (405);

a peripheral card region housed in the removable component (400), the peripheral card region being generally adjacent to the back wall (405) and being separate from the airflow passage, the peripheral card region for housing peripheral cards that include interfaces;

a perforated I/O panel (320) integrated with the back wall (405), the perforated I/O panel (320) for receiving the interfaces included with the peripheral cards and for allowing air to flow into the peripheral card region;

a plate (420) proximately connected to the front wall, the plate (420) covering at least a portion of the peripheral card region and for directing airflow from the perforated I/O panel (320) to the airflow passage; and a peripheral card divider housed in the peripheral card region, the peripheral card divider arranged generally perpendicular to the front wall.

10. The computer system chassis of claim 9, wherein the plate is in a generally horizontal orientation.

11. The computer system chassis of claim 9, wherein the perforated interface plate includes a plurality of perforations, each of the plurality of perforations sized so as to promote even airflow through the perforated interface plate.

12. The computer system chassis of claim 9, further comprising:

a top plate connected with the chassis shell, the top plate for covering the first region of the chassis and for engaging the plate.

13. The computer system of claim 9, further comprising a card protector top plate proximately connected to the plate, the card protector top plate and the plate together for channeling an airflow from the first region of the chassis to the airflow passage between the front wall and the back wall.

14. The computer system of claim 13, wherein the plate is perforated for allowing air to flow from the perforated I/O panel to the plate and the card protector top plate.

* * * * *